(12) United States Patent
Shen

(10) Patent No.: US 6,181,135 B1
(45) Date of Patent: Jan. 30, 2001

(54) MRI SYSTEM WITH FRACTIONAL DECIMATION OF ACQUIRED DATA USING LINEAR PHASE SHIFT

(75) Inventor: Jie F. Shen, New Berlin, WI (US)

(73) Assignee: General Electric Company, Milwaukee, WI (US)

(*) Notice: Under 35 U.S.C. 154(b), the term of this patent shall be extended for 0 days.

(21) Appl. No.: 09/207,456

(22) Filed: Dec. 8, 1998

(51) Int. Cl.$^7$ .................................................. G01V 3/00
(52) U.S. Cl. ............................................. 324/309; 324/307
(58) Field of Search ................................. 324/309, 307, 324/314

(56) References Cited

U.S. PATENT DOCUMENTS

| | | | |
|---|---|---|---|
| 5,036,281 | * 7/1991 | Li | 324/309 |
| 5,226,418 | * 7/1993 | Bernstein et al. | 128/653.3 |
| 5,347,216 | * 9/1994 | Foo | 324/309 |
| 6,046,591 | * 4/2000 | King et al. | 324/309 |

* cited by examiner

Primary Examiner—Christine K. Oda
Assistant Examiner—Brij B. Shrivastav
(74) Attorney, Agent, or Firm—Quarles & Brady; Christian G. Cabou; Phyllis Y. Price

(57) ABSTRACT

An MRI system acquires NMR signals at a fixed sample rate. The acquired NMR signals are decimated to produce an output NMR signal at a prescribed sample rate. The acquired NMR signal is fast Fourier transformed to the frequency domain, and additional signal samples are produced by phase shifting in the frequency domain. The frequency domain signal samples needed to produce the prescribed sample rate are then fast Fourier transformed back to the time domain to produce the output NMR signal.

11 Claims, 4 Drawing Sheets

MRI SYSTEM WITH FRACTIONAL DECIMATION OF ACQUIRED DATA USING LINEAR PHASE SHIFT

BACKGROUND OF THE INVENTION

The field of the invention is nuclear magnetic resonance imaging methods and systems. More particularly, the invention relates to the sampling of acquired NMR signals at prescribed sample rates.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The rate at which the received NMR signals are digitized is an important scan parameter. The signal-to-noise ratio of an NMR image can be improved if the effective bandwidth (which is the inverse of the sampling period per point) is reduced. This is usually accomplished by widening the read-out gradient pulse and reducing the amplitude of the read-out gradient to encode the positions into a narrower bandwidth and to retain the same spatial resolution. The anti-aliasing filters are modified to match the reduced bandwidth and the analog-to-digital conversion (A/D) sample rate is reduced to acquire the same number of samples over the longer read-out gradient pulse. The SNR improvement is proportional to the square root of the bandwidth reduction.

A higher SNR and corresponding lower A/D sample rate is not always desired, since the increase in SNR is accompanied by two disadvantages. First, the minimum echo delay ($TE_{1min}$) for the first NMR echo signal is increased due to the widening of the read-out gradient pulse. For some rf spin echo acquisitions the delay is twice what might be expected, since the time between the 90° RF excitation pulse and the 180° RF pulse must also be increased to orient the NMR echo signal at the center of the widened read-out gradient pulse. The lengthening of $TE_1$ is a disadvantage when $T_2$ weighting of the NMR image is not desired. A second disadvantage which accompanies this increase in SNR is an increase in chemical shift artifacts. Since the bandwidth per image pixel is reduced, the frequency difference between lipid and water resonances becomes more significant. For example, at 1.5 Tesla main field strength, the approximately 220 Hertz difference in resonant frequency will appear approximately three times further apart in an image where each image pixel represents a difference in frequency of 42 Hertz rather than 125 Hertz. The result is an increased relative displacement between the lipid structures and the water structures. This displacement can be especially disturbing with images reconstructed from the first NMR echo signal since the second echo signal often has lower lipid signal components due to the shorter $T_2$ decay time of lipids.

To allow maximum flexibility of the SNR, spatial resolution, and field of view of an image, a completely adjustable A/D sampling rate is desirable.

A number of methods have been used in prior MRI systems to enable the A/D sample rate to be precisely adjusted to enable the best image acquisition possible. One approach is to employ an analog-to-digital converter circuit ("ADC") in which the sample rate is adjustable and can be precisely controlled. Such ADCs are expensive.

Another approach is to employ an ADC which has a fixed sample rate far higher than that required to achieve the desired sample rates. In such designs the sample rate is reduced to the prescribed A/D sample rate by using decimation. The decimation ratio (d) is an integer value. Decimation effectively reduces the A/D sample rate to one-half (d=2) by selecting alternate digitized samples, to one-third (d=3) by selecting every third digitized sample, to one-fourth (d=4) by selecting every fourth digitized sample, etc. The difficulty with this method is that the effective A/D sample rate can only be changed in discrete steps. If the ADC sample rate is very high and the decimation ratio (d) necessary to achieve operable A/D sample rates is very high (e.g. d=10, 11, 12), these discrete steps are relatively small and a desired A/D sample rate can be achieved with reasonable accuracy. However, ADC devices that operate at such high sample rates are expensive.

SUMMARY OF THE INVENTION

The present invention is a method for using a fixed sample rate ADC to acquire NMR image data and produce an image data set at a prescribed sample rate. More specifically, the method includes transforming the acquired time domain NMR image data samples to the frequency domain; producing additional frequency domain image data samples by shifting the phase of the transformed NMR image data samples, selecting a set of frequency domain image data samples; and transforming the selected set of frequency domain image data samples to the time domain to produce an image data set at the prescribed sample rate. The linear phase shift in the frequency domain is equivalent to interpolation between sample points in the time domain. Only the frequency domain image data samples needed to produce the prescribed time domain sample rate are selected and transformed back to the time domain.

GENERAL DESCRIPTION OF THE INVENTION

Figure 1:
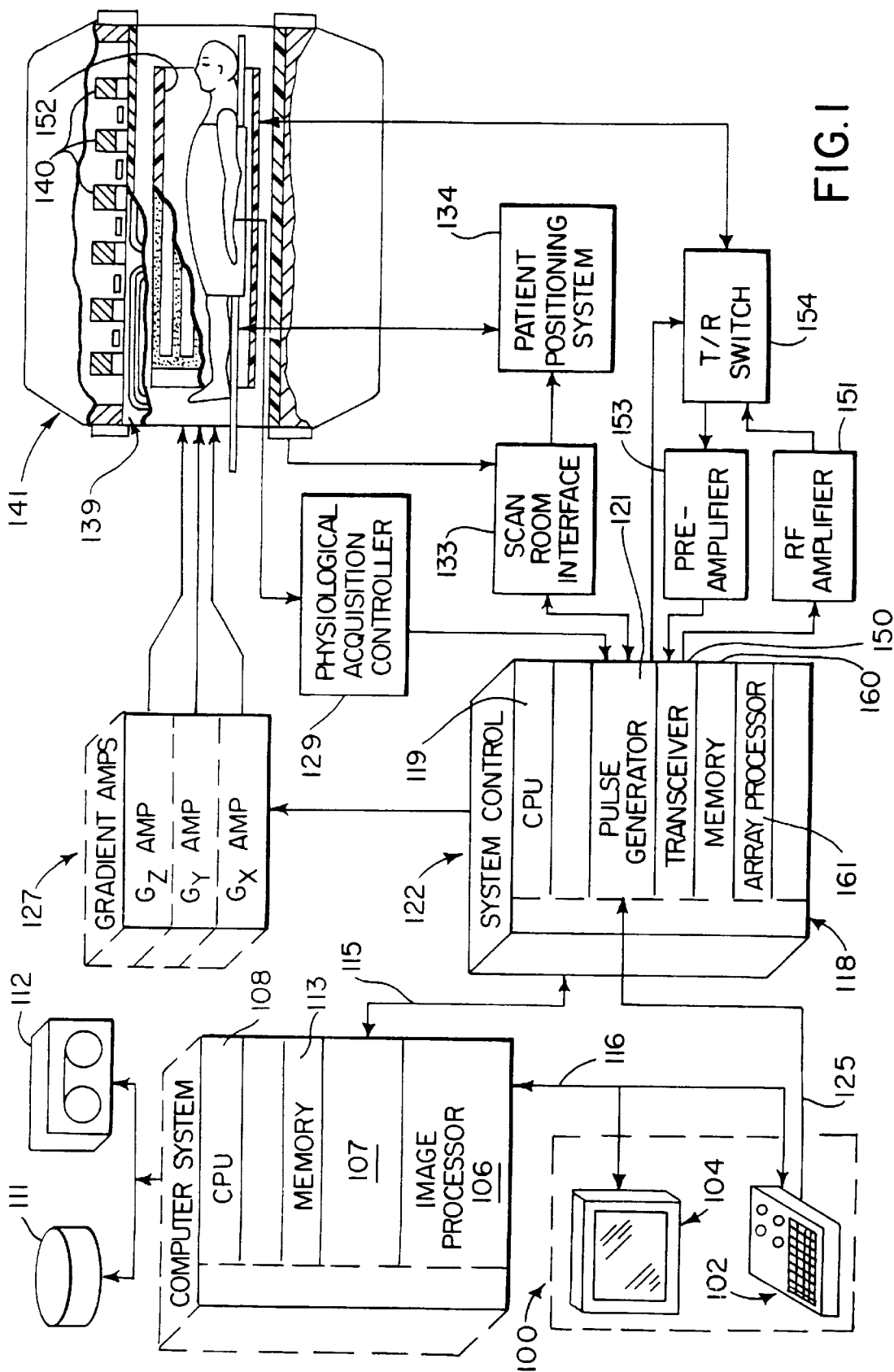
FIG. 1 is a block diagram of an MRI system which employs the present invention.

The present invention reduces the amount of memory and computation time needed to change the sample rate of an acquired NMR signal. The acquired signal is sampled at a fixed rate with a time interval $\Delta t$ between samples. The prescribed sample rate has intervals $m\Delta t/n$, where $m/n$ is the fractional decimation ratio. The method may be divided into two parts. In the first part, the number of digitized NMR signal samples is extended to the next power of 2 by zero padding; the zero-padded sequence is then Fourier transformed using an FFT; and the resulting frequency domain signal is multiplied by a band-limiting window function. This part is no different from prior methods based on zero padding. During the second part of the method, the band-limited frequency-domain data is phase shifted to produce additional frequency domain data. This data is transformed back to the time domain using an inverse FFT. Only the data points which fall at multiples of $m\Delta t/n$ are included in the inverse FFT, and when m is a power of 2, the inverse FFT of these points can be performed much faster than the inverse FFT that includes all time-domain points.

The first part of the method consists of the following three steps:

1. Extend the number of digitized samples to the next power of 2 by padding $$\{S_0, S_1, S_3, \ldots S_{MO-1}, 0, 0, \ldots, S_{m-1}=0\}, \quad (1)$$

where M is a power of 2.

2. Calculate the Fourier transform of the zero-padded data using a FFT $\{S_0, S_1, S_2, S_3, \ldots, S_{M-1}\}$, where $$S_k = \sum_{j=0}^{M-1} s_j e^{i2\pi k/M} \quad (2)$$

3. Multiply the Fourier transform by a windowing function $\{H_0, H_1, H_2, H_3, \ldots, H_{M-1}\}$ $$\{S_0H_0, S_1H_1, S_2H_2, S_3H_3, \ldots S_{M-1}H_{M-1}\} \quad (3)$$

The second part of the method calculates the prescribed time domain signal samples.$\{X_0, X_1, X_2, X_3, \ldots, X_{N-1}\}$ by using an inverse FFT and a linear phase shift.

Let $\{V_0, V_1, V_2, V_3, \ldots, V_{M-1}\}$ be the inverse Fourier transform of $\{S_0H_0, S_1, H_1, \ldots S_{M-1}H_{M-1}\}$. We note that $V_{qm}$ and $X_{qn}$ coincide at $qm\Delta t$, where $q=0, 1, \ldots, (M/m)-1$, and we therefore have $X_{qn}=V_{qm}$. The number of multiplications required to calculate all $V_j$'s using the inverse FFT is proportional to $M \log_2 M$. However, only those with index being multiples of m fall at the desired time point, and the rest are not needed. When only $V_{qm}$ are needed, the inverse Fourier transform can be reduced from length M to length M/m. The proof is given below.

$$v_{qm} = \sum_{k=0}^{M-1} S_k H_k e^{-i2\pi qmk/M} = \sum_{k=0}^{M-1} S_k H_k e^{-i2\pi qk/(M/m)}$$

Let L=M/m. The last summation can be written as $$v_{qm} = \sum_{k=0}^{M-1} S_k H_k e^{-i2\pi qk/L}$$

The summation of M terms may be broken up into m summations of L terms each $$v_{qm} = \sum_{k=0}^{L-1} S_k H_k e^{-i2\pi qk/L} + \sum_{k=0}^{2L-1} S_k H_k e^{-i2\pi qk/L} + \ldots + \sum_{k=(m-1)L}^{M-1} S_k H_k e^{-i2\pi qk/L}$$

Replacing the index k by pL+k in the p'th summation above and then using the unity relation $e^{-i2\pi qk/L}=1$, the summations are reduced to $$v_{qm} = \sum_{k=0}^{L-1} S_k H_k e^{-i2\pi qk/L} + \sum_{k=0}^{L-1} S_{L+k} H_{L+k} e^{-i2\pi qk/L} + \ldots +$$

$$\sum_{k=0}^{L-1} S_{(m-1)L+k} H_{(m-1)L+k} e^{-i2\pi qk/L}$$

$$= \sum_{k=0}^{L-1} \left( \sum_{p=0}^{m-1} S_{pL+k} H_{pL+k} \right) e^{-i2\pi qk/L}$$

The inner summation does not require any multiplications and the outer summation can be evaluated using an inverse FFT of length L. The number of multiplications required is proportional to $(M/m)\log_2(M/m)$, which is much less than $M \log_2 M$.

To calculate the n−1 points between $X_{qn}$ and $X_{(q+1)n}$, the inverse FFT is repeated n−1 times and, before each inverse FFT, the frequency-domain data is phase-shifted by a linear phase equal to $2\pi l/(nM)$, where I is the iteration index and varies from 1 to n-1. The detailed procedures are given below.

4. Apply a linear phase shift to $\{S_0H_0, S_1H_1, S_2H_2, S_3H_3, \ldots, S_{m-1}H_{m-1}\}$ $$\{S_0H_0, S_1H_1e^{-i\alpha}, S_2H_2e^{-i2\alpha}, S_3H_3e^{-i3\alpha}, \ldots, S_{m-1}H_{m-1}e^{-(m-1)\alpha}\}$$

where $\alpha=2\pi l/(nM)$. Note that for the first iteration $\alpha=0$ and the linear phase shift may be skipped because the existing frequency domain data is reproduced.

5. Divide the M data points into m groups of size L=M/m.

Group 1: $\{S_0H_0, S_1H_1e^{-i\alpha}, S_2H_2e^{-i2\alpha}, \ldots, S_{L-1}H_{L-1}e^{-i(L-1)\alpha}\}$ Group 2: $\{S_LH_Le^{-iL\alpha}, S_{L+1}H_{L+1}e^{-i(L+1)\alpha}, S_{L+2}H_{L+2}e^{-i(L+2)\alpha}, \ldots, S_{2L-1}H_{2L-1}e^{-i(2L-1)\alpha}\}$

...

Group m: $\{S_{(m-1)L}H_{(m-1)L}e^{-i(m-1)L\alpha}, S_{(m-1)L+1}H_{(m-1)L+1}e^{-i[(M-1)L+1]\alpha}, S_{(m-1)L+2}H_{(m-1)L+2}e^{-i[(M-1)L+2]\alpha}, \ldots, S_{M-1}H_{m-1}e^{-i(M-1)\alpha}\}$ 6. Add the corresponding data points in each group $$\{U_0, U_1, U_2, \ldots, U_{L-1}\}$$

where $$U_k = \sum_{p=0}^{m-1} S_{pL+k} H_{pL+k} e^{-i(pL+k)\alpha} \text{ where } k = 0, 1, 2, \ldots, L-1$$

7. Perform the inverse FFT on $\{U_k\}$ $$x_{qn+l} = \sum_{k=0}^{L-1} U_k e^{-i2\pi qk/L} \text{ where } q = 0, 1, 2, \ldots L-1$$

The number of samples calculated is equal to nM/m, which is usually more than N. Only the first N samples are needed and the rest are in the extended time region created by the initial zero padding to make the sequence length a power of 2.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellow. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
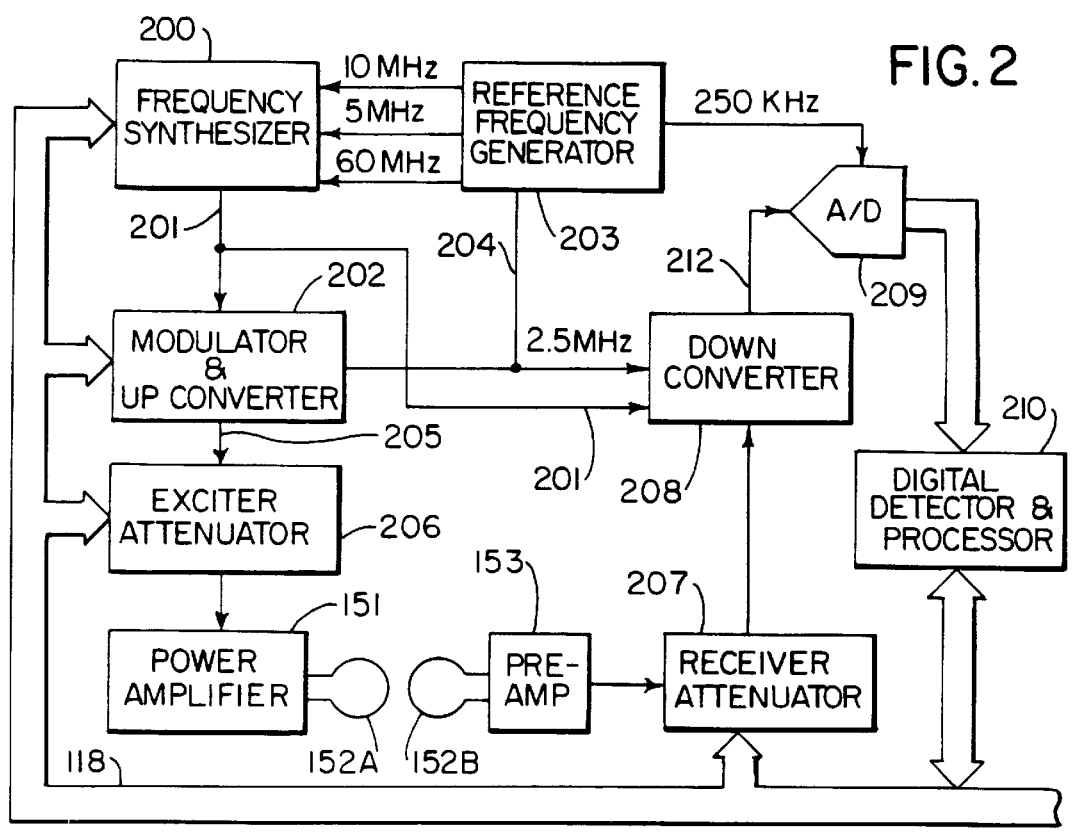
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital converter (ADC) 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received time domain NMR signal are output through backplane 118 to the memory module 160 where they are employed to reconstruct an image. In the preferred embodiment the ADC 209 operates at a fixed sample rate of 500 kHz so that complex pairs I and Q are sampled at a 250 kHz rate (i.e $\Delta t=4$ $\mu$sec.), yielding a maximum bandwidth of $\pm 125$ kHz.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

The present invention is implemented on the digitized I and Q samples of each acquired time domain NMR signal. A prescribed receive bandwidth is established prior to the scan, to provide the desired sampling interval m$\Delta$t/n, and the number ($M_0$) of digitized samples is also prescribed. The acquired data is digitized at sampling intervals $\Delta$t and it is then processed according to the present invention to produce a data set $X_0$, $X_1$, $X_2$, . . . , $X_{N-1}$ which is a representation of the acquired data digitized at the prescribed sampling interval. This data set is employed in the usual fashion to reconstruct an image at the completion of the scan as described above. The processing of the present invention is thus performed between the acquisition of each view of data and the use of that view in the image reconstruction process. This invention enables any arbitrary bandwidth to be prescribed (less than the fixed bandwidth of the receiver) with minimal impact on the image reconstruction time.

Figure 3:
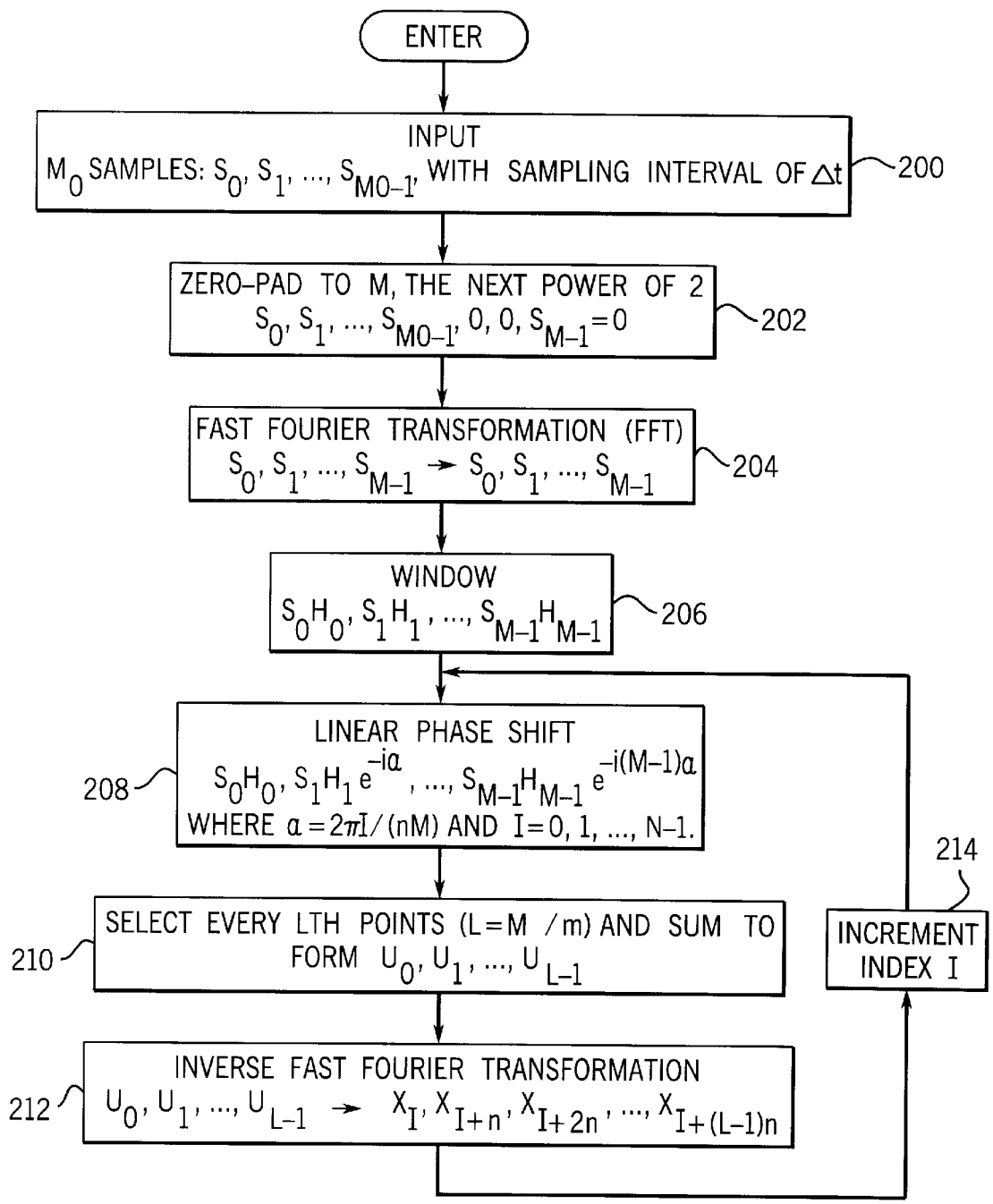
FIG. 3 is a flow chart of a preferred method used by the MRI system of FIG. 1 to practice the present invention.

Referring particularly to FIG. 3, as each time domain NMR signal is acquired and digitized as described above, the signal samples are input as indicated by process block 200. The MO samples are zero padded at process 202 by adding zero values until the total number of samples is equal to M, a number equal to the next power of two. For example, if 192 samples are acquired, the time domain NMR signal is zero-padded to contain 256 samples. This is done to enable a fast Fourier transform (FFT) to be performed as indicated at process block 204 and described above in equation (2).

As indicated at process block 206, the next step is to multiply the transformed, frequency domain NMR signal (S) by a window function (H). The high frequency components of the windowed frequency domain signal (S*H) are discarded outside the desired receiver bandwidth.

A loop is entered next in which additional frequency domain NMR signal samples are produced and transformed back to the time domain. As indicated at process block 208, this is achieved by shifting the phase of each frequency domain signal sample (S*H) by an angle equal to the sample number times $\alpha$, where:

$\alpha = 2\pi l/(nM)$;

m/n fractional decimation ratio and m is a power of 2; and l=an index ranging from zero to n−1.

The result is a data set of Mn phase shifted, frequency domain signal samples. These could all be transformed back to the time domain, however, it is one of the discoveries of the present invention that the data size can be greatly reduced and the processing can be substantially shortened by combining frequency-domain signal samples prior to transformation. As indicated at process block 210, this is accomplished by selecting every Lth sample in the data set and summing them together, where:

L=M/m.

The Mn frequency-domain samples are thus reduced in number to L samples to form a frequency-domain data set:

$U = U_0, U_1, \ldots U_{L-1}$.

The resulting smaller frequency domain data set U is then fast Fourier transformed back to the time domain as indicated at process block 212. As indicated at process block 214, the index I is then incremented and the process loops back to block 208 to produce another set of phase shifted frequency domain signal samples. This loop is performed n times to produce n sets of L time domain signal samples.

Figure 4:
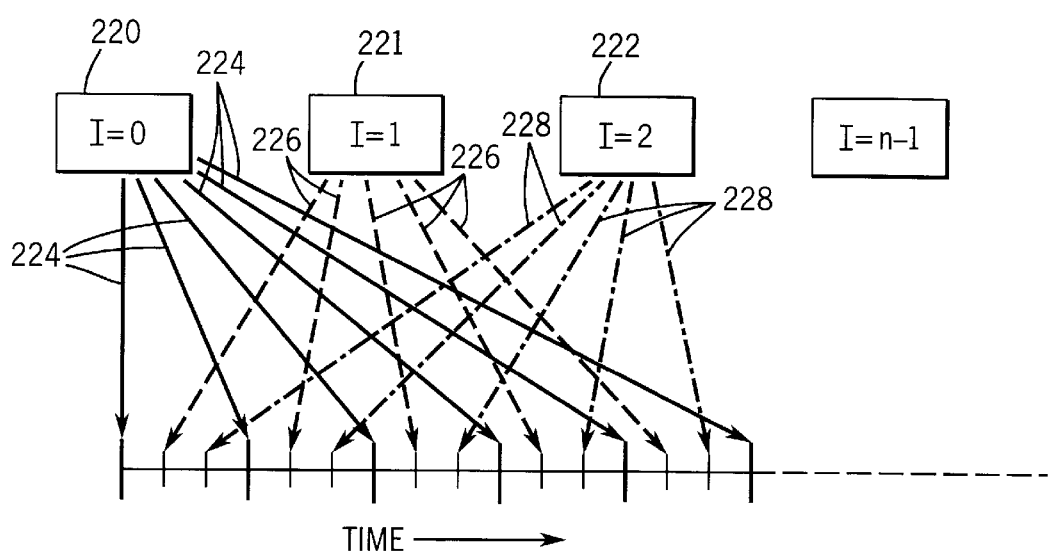
FIG. 4 is a pictorial representation of the relationship of the phase shifted frequency domain data and the time domain data points produced by the method of FIG. 3.

Referring particularly to FIG. 4, three successive sets of L time domain signal samples produced at process block 212 are indicated by data structures 220–222. The first set of time domain signal samples 220 produced with the index I set to zero produces time domain signal samples at original sample times as indicated by solid lines 224. The second set of time domain signal samples 221 produced with the index I set to 1 yields time domain signal samples at times indicated by dashed lines 226 which are interleaved with the samples for the first set 220. Similarly, the third set of time domain signal samples 222 produced with the index I set to 2 yields time domain signal samples at times indicated by dotted lines 228 which are interleaved with the samples from the first two data sets 220 and 221. The net result of all the time domain data sets produced by process block 212 for I=0 to I=n−1 is an output time domain NMR signal in which the samples are spaced at m$\Delta$t/n to provide the prescribed sample rate.

What is claimed is:

1. A method for decimating a time domain signal sampled at intervals $\Delta$t at a decimation ratio of m/n, the steps comprising:

a) Fourier transforming the time domain signal to produce a set of frequency domain signal samples b) producing additional frequency domain signal samples by phase shifting the set of frequency domain signal samples; and c) Fourier transforming frequency domain signal samples and additional frequency domain signal samples to produce an output time domain signal sampled at intervals m$\Delta$t/n.

2. The method as recited in claim 1 in which the time domain signal is zero padded such that the number of samples therein is equal to a number which is a power of two;

and the Fourier transformation in step a) is a fast Fourier transform.

3. The method as recited in claim 2 which includes:

d) multiplying the set of frequency domain signal samples by a window function that limits the bandwidth before performing step b).

4. The method as recited in claim 3 in which step b) is performed n−1 times.

5. The method as recited in claim 4 in which selected ones of the frequency domain signal samples and additional frequency domain signal samples are selectively combined prior to performing step c) to reduce the number of samples being Fourier transformed.

6. The method as recited in claim 5 in which the selection of frequency domain signal samples to be combined is determined in part by the value of m.

7. The method as recited in claim 3 in which step d) produces M frequency domain signal samples and step b) is performed n−1 times.

8. The method as recited in claim 7 in which the phase shift in step b) is proportional to $\alpha = 2\pi l/(nM)$, where l is an iteration index from 1 to n−1 which indicates the number of times step b) has been performed.

9. The method as recited in claim 7 in which every Lth frequency domain sample and every Lth additional frequency domain sample produced by performing step b) is summed to form L frequency domain samples for use in performing step c), where L=M/m.

10. The method as recited in claim 7 in which step c) is performed each time after step b) is performed.

11. The method as recited in claim 10 in which every Lth additional frequency domain sample produced in step b), is summed to form L frequency-domain samples for use in performing step c), where L=M/m.

* * * * *